United States Patent Office 3,309,227
Patented Mar. 14, 1967

3,309,227
WAX MASKING PROCESS

Gerald E. McTeague, Sun Valley, Calif., assignor to General Precision, Inc., a corporation of Delaware No Drawing. Filed June 17, 1963, Ser. No. 288,532
1 Claim. (Cl. 117—212)

This invention relates to a process for depositing thin films, and more particularly to a new and novel process for the deposition of discrete miniature thin film elements on the surface of a substrate material by the use of masks which are capable of removal by an agent which will not have a deleterious effect on the thin film material.

Various types of thin film elements are being used in industry, particularly in electronic equipment in which it is desirable to obtain maximum reliability under severe environmental conditions and where there is a minimum of available space. For example, entire electronic circuits are in common use in which the various miniaturized electronic components are inter-connected by thin conductors that are coated on a nonconductive substrate material, such as plastic, or other foundation materials. Similarly, resistances, capacitors, transformers and the interconnecting conductors have been deposited on substrates to form completely integrated miniature circuits.

The method most commonly used to form discrete miniature thin film elements on a substrate is to completely coat one surface of the substrate with the thin film material, print the desired configuration over the coating with a special resistant ink, and then remove all the coating that is not protected by the resistant ink. This ink is impervious to the solution used to remove the thin film material; however, it may be removed by a solvent which dissolves the resistant ink but does not affect the underlying thin film material. Unfortunately, there are certain materials that are desirable to use as thin film elements that cannot be deposited upon a substrate material by the process outlined above. As an example, lead selenide, which may be used as a detector of infrared radiation, cannot be exposed to halogenated compounds, acids, or acid fumes, such as are used as the solvent to remove the above-mentioned resistant ink without destroying its detection properties.

A second method used to form discrete miniature thin film elements on a substrate is to temporarily cement to the substrate a stencil through which the desired elements to be deposited are printed on the substrate, and after which the masks are removed by a solvent. It is impossible to use this technique with certain thin film materials, such as lead selenide, because the solvent used to remove the adherent masks is necessarily a halogenated compound which destroys the infrared detection capabilities of lead selenide.

Heretofore there has been no known method that could be used for the mass production of thin film materials that are damaged or destroyed by exposure to halogenated compounds, acids, or acid fumes. The present invention, however, provides a method by which certain materials, such as lead selenide, may be conveniently and accurately deposited on substrate material without damage to the thin film.

Briefly described, this invention provides a method by which lead selenide infrared detectors may be mass produced. The process comprises the principal steps of vapor depositing upon the surface of the substrate a wax mask defining the desired configuration of the lead selenide elements, depositing the lead selenide on the exposed areas of the substrate, and removing the wax mask with a solvent that does not deleteriously affect the useful properties of the lead selenide.

The present invention has for its primary object the provision of a novel method of vapor depositing upon a substrate a wax mask that may be subsequently removed by a solvent which does not affect the properties of certain thin film materials, such as lead selenide, that have been deposited through openings in the wax mask onto the substrate.

The novel features of the invention are defined with particularity in the appended claims. The invention itself, however, together with additional objects and advantages thereof, will best be understood from the following description of a specific example of the novel method of producing miniature lead selenide infrared detectors upon a quartz or glass substrate.

Because of the granular structure of the lead selenide film used in the specific example, it has relatively poor adhesion properties when deposited upon a smooth surface of a substrate, such as quartz. It is, therefore, highly desirable to roughen the substrate surface. This may be done, for example, by lightly grinding the surface on a flat plate upon which has been dusted a thin layer of very fine abrasives. It has been found that roughening the substrate surface not only helps the lead selenide to adhere, but also increases the effective area of the lead selenide detector so that it is capable of absorbing a greater quantity of impinging infrared than could be absorbed by a flat, or polished, lead selenide film.

The next step is to apply to the roughened surface of the substrate a masking substance in the form of a negative image of the configuration of the lead selenide detectors to be applied. The term "negative," for the purpose of this specification, is adopted from the photographic terminology and implies that the configuration of the finished lead selenide detectors will conform to the openings in the negative masking substance. Similarly, the term "positive" will infer that the configuration of the finished detectors will be identical to the configuration of the masking substance.

Since lead selenide is deleteriously affected by halogenated solvents, it is necessary that the masking substance be of a type that can be removed or dissolved by a non-halogenated solvent. It has been found that certain waxes, such as Carnauba wax, can readily be dissolved or softened for easy removal by a non-halogenated solvent, such as toluene.

The negative mask of Carnauba wax is applied to the roughened surface of the substrate by first firmly affixing to the substrate surface a positive template having a configuration identical to the desired configuration of the lead selenide element. The positive template may be constructed of a thin metallic shim material that may be clamped to the surface of the substrate; for complex configurations it may be developed by photographic process; or for simple configurations it may merely be a template of adhesive tape.

The Carnauba wax may be readily deposited through the template onto the surface of the substrate by mounting the substrate and its template in the top of a bell jar approximately seven inches above a heated container of Carnauba wax. Carnauba wax, which is a brittle, yellowish wax derived from the Brazilian wax palm, melts at approximately 85° C. and may be readily evaporated in the heated container in the bell jar at the temperature of approximately 300° C. in a vacuum of between $1\times10^{-4}$ and $5\times10^{-4}$ microns of mercury. In order to assure that the wax adheres to the substrate, it is desirable that the substrate be held in contact with a heatsink which may be a container of cool liquid, or preferably a heavy aluminum plate adapted to conduct heat from the substrate.

In order to monitor the amount of deposition of the Carnauba wax to insure that its thickness is always maintained constant, a piezo-electric crystal that is ground to resonate at 4.5 megacycles, may be placed near the substrate in the bell jar. Carnauba wax vapor from the heated container in the bell jar is thus deposited upon the crystal as it is being deposited on the substrate, and the increased crystal dimensions caused by the deposited wax will lower the resonant frequency of the crystal as the wax deposit increases. In monitoring the wax deposit by such a method, it was found that the proper amount of Carnauba wax vapor had been deposited upon the substrate when the resonant frequency of the piezo-electric crystal dropped 2000 cycles from its original 4.5 megacycles. At this point the vapor deposition of the wax is stopped, the substrate is removed from the bell jar, and the positive template carefully removed from the substrate to reveal the negative mask of Carnauba wax.

The next step is to deposit the lead selenide over the entire surface of the substrate. It is obvious that if the lead selenide covers the entire surface, portions of it will be deposited upon the Carnauba wax mask that was previously deposited by vapor deposition. These portions, however, will be removed along with the Carnauba wax in a subsequent step of the process. It has been found that highly sensitive lead selenide cells can be deposited upon the substrate by immersing the substrate in an aqueous solution of 0.26 moler lead acetate and 0.20 moler selenourea at a temperature of 50° C. for 25 minutes. Five of such immersions may be made in sequence with a distilled water wash between each immersion in order to build up the desired thickness of the lead selenide. After the fifth immersion the substrate with the deposited lead selenide is again washed and then air dried at a temperature below the melting point of the Carnauba wax.

The Carnauba wax pattern, along with the lead selenide deposited upon it, is then removed by immersing the substrate for approximately five minutes at room temperature in toluene. Toluene, a non-halogenated solvent that has no destructive effect upon the lead selenide, will penetrate into the Carnauba wax, causing it to soften or dissolve. If portions of the wax persist and are not readily dissolved from the surface of the substrate, they may be easily removed by applying a light ultra sonic agitation. This may be done by floating the container of toluene in a water bath that is subjected to the ultra sonic agitation.

In order to increase the sensitivity of the lead selenide infrared cells that had been deposited upon the quartz substrate, it is desirable to oxidize the lead selenide. This may be accomplished by applying heat at approximately 430° C. for 15 minutes in a chamber that was originally evacuated to one fifth atmosphere of air at a relative humidity of less than 45%.

The final step in the construction of the lead selenide infrared cells is to attach electrical leads to each of the cells on the substrate. This may be accomplished by conventional plating methods, and forms no part of the present invention. In some cases it may be desirable to deposit the lead selenide cells onto a substrate that had previously been prepared with plated electrical connectors. In such a case the connectors may be plated upon the substrate by conventional methods immediately after the substrate surface has been roughened and prior to the vacuum deposition of the Carnauba wax.

A typical example of the production of lead selenide infrared detectors has been explained to illustrate the use of the Carnauba wax deposition process of this invention. It is obvious that this process may be used for many other applications, and is of particular value where the material to be deposited upon a substrate can be damaged by halogenated compounds, acids, or acid fumes. It is intended, therefore, that the invention not be limited to lead selenide or other infrared detectors, but shall be limited only to the extent of the appended claim.

I claim:

A method of forming upon a substrate discrete thin film infrared detector elements of deposited lead selenide, the detection properties of which are deleteriously affected by the halogenated solvents of photo resist processes, said method comprising the steps of:

roughening the surface of the substrate with a fine abrasive material, affixing to said roughened substrate a template having the configuration of the detector elements, placing said substrate in a vacuum of between $1 \times 10^{-4}$ and $5 \times 10^{-4}$ microns of mercury, evaporating Carnauba wax at a temperature of approximately 300° C. onto the surface of said substrate in said vacuum, removing said template from said substrate, applying the lead selenide detector material to the surface of said substrate, said material applied at a temperature below the melting point of said Carnauba wax, and, removing said Carnauba wax by immersnig said substrate in toluene.

References Cited by the Examiner

UNITED STATES PATENTS

| | | | |
|---|---|---|---|
| 2,159,351 | 5/1939 | Burns | 117—106X |
| 2,957,779 | 10/1960 | Bolton | 117—212 |
| 3,096,189 | 7/1963 | Kranz et al. | 117—158 |
| 3,115,423 | 12/1963 | Ashworth | 117—5.5 |
| 3,226,255 | 12/1965 | Cieniewicz et al. | 117—212 |

FOREIGN PATENTS

| | | |
|---|---|---|
| 452,816 | 11/1948 | Canada. |

ALFRED L. LEAVITT, *Primary Examiner.*

WILLIAM L. JARVIS, *Examiner.*